United States Patent [19]
Aiello et al.

[11] Patent Number: 6,127,723
[45] Date of Patent: Oct. 3, 2000

[54] INTEGRATED DEVICE IN AN EMITTER-SWITCHING CONFIGURATION

[75] Inventors: Natale Aiello, Catania; Atanasio La Barbera, Palermo; Stefano Sueri; Sergio Spampinato, both of Catania, all of Italy

[73] Assignee: SGS-Thomson Microelectronics, S.r.l., Agrate Brianza, Italy

[21] Appl. No.: 09/016,073

[22] Filed: Jan. 30, 1998

[51] Int. Cl.[7] ............... H01L 27/082; H01L 27/102; H01L 29/70; H01L 31/11
[52] U.S. Cl. ............... 257/582; 257/574; 257/575; 257/593; 438/205; 438/206; 438/210
[58] Field of Search ............... 257/575, 580, 257/582, 593, 574; 438/205, 206, 210

[56] References Cited

U.S. PATENT DOCUMENTS

| | | | |
|---|---|---|---|
| 4,205,332 | 5/1980 | Conti et al. ............... | 257/578 |
| 4,755,772 | 7/1988 | Khanna ............... | 331/109 |
| 4,884,114 | 11/1989 | Spenke et al. ............... | 257/125 |
| 5,866,461 | 2/1999 | Puzzolo et al. ............... | 438/323 |

*Primary Examiner*—Mahshid Saadat
*Assistant Examiner*—Allan R. Wilson
*Attorney, Agent, or Firm*—Jenkens & Gilchrist, P.C.; Theodore E. Galanthay

[57] ABSTRACT

An integrated device in an emitter-switching configuration comprises a first bipolar transistor having a base region, an emitter region, and a collector region, a second transistor having a charge-collection terminal connected to an emitter terminal of the first transistor, and a quenching element having a terminal connected to a base terminal of the first transistor. The quenching element is formed within the base region or the emitter region of the first transistor.

32 Claims, 8 Drawing Sheets

FIG. 1

(Prior Art)

INTEGRATED DEVICE IN AN EMITTER-SWITCHING CONFIGURATION

FIELD OF THE INVENTION

The present invention relates to an integrated device in an emitter-switching configuration.

BACKGROUND OF THE INVENTION

A particular type of device in an emitter-switching configuration is constituted by a high-voltage bipolar power transistor and by a low-voltage signal transistor (bipolar or field-effect) in which the emitter terminal of the high-voltage transistor is connected to the charge-collection (collector or drain) terminal of the low-voltage transistor. Typically, the high-voltage transistor has a collector-base, open-emitter breakdown voltage ($BV_{cbo}$) which may reach 2 kV, whereas the low-voltage transistor has a breakdown voltage below 60V. The rapid quenching of the low-voltage transistor enables the high-voltage transistor to be quenched extremely quickly and this configuration is therefore commonly used in applications in which the high-voltage transistor is required to be able to switch rapidly between its conducting and cut-off states.

Figure 1:
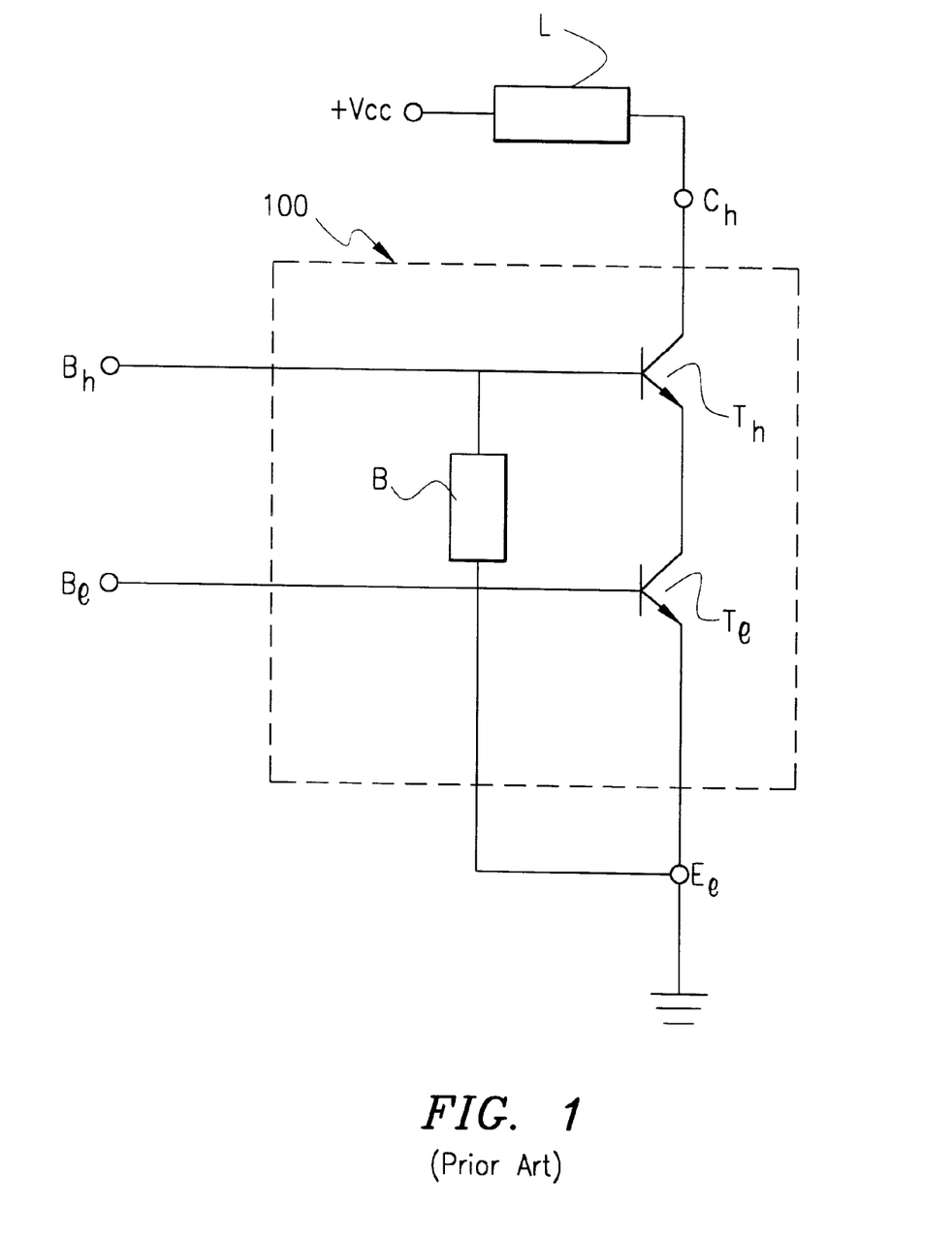
FIG. 1 is a circuit diagram comprising a device in an emitter-switching configuration.

An example of a circuit layout comprising a device 100 in an emitter-switching configuration is shown in FIG. 1. The device 100 comprises a high-voltage bipolar transistor Th the emitter terminal of which is connected to the collector terminal of a low-voltage bipolar transistor Tl. The device 100 is connected in the circuit shown in the drawing by means of the collector terminal Ch and the base terminal Bh of the transistor Th, and by the emitter terminal El and the base terminal Bl of the transistor Tl. In particular, the terminals Bh and Bl constitute the control terminals of the device, enabling the connection between two branches of the circuit connected to the terminals El and Ch to be opened and closed alternately. Typically, the terminal El is connected to a reference terminal (earth); the terminal Ch is connected to the first terminal of a load L, the second terminal of which is connected to the positive terminal of a supply +Vcc (the negative terminal of which is connected to the earth terminal). The device 100 also includes a quenching element B constituted, for example, by a Zener diode or by a chain of diodes connected to the base terminal of the transistor Th and to the emitter terminal of the transistor Tl (or directly to the earth terminal).

During the opening of the device 100, the quenching time of the transistor Th is greater than the quenching time of the transistor Tl because of the large accumulation of charge in its base region. After the transistor Tl is quenched, bringing the emitter current of the transistor Th to zero, the collector current of the transistor Th therefore flows through its base and is discharged to earth through the quenching element B. Once the transistor Th has eliminated all of the residual charge in its base, this transistor is quenched and its collector current, and hence the current in the load L, is brought to zero.

In known devices in an emitter-switching configuration, the quenching element is formed, for example, by discrete components suitably connected to the two transistors; however, this solution increases the production cost and the size of the device as a whole.

In the case of a mixed (signal and power) integrated circuit in which both the low-voltage control circuits and the high-voltage power devices are integrated on the same semiconductor chip, a different known solution consists of the formation of the quenching element within an insulated well of the region in which the control circuits are disposed. A disadvantage of this solution is that it requires the formation of a dedicated insulated recess. This involves greater circuit complexity in order to polarize the insulated recess correctly, and an increase in the size of the device as a whole. Moreover, the insulated recess creates parasitic components with the high-voltage transistor, and these tend to lengthen the quenching times of the device, consequently increasing the power dissipated.

Finally, in both solutions, the quenching element is connected to the base terminal of the high-voltage transistor by means of an external connection (for example, a metal wire) or a dedicated metal track. Known structures therefore have an intrinsic resistance in series with the quenching element resulting from these connections and from the base electrode of the high-voltage transistor, increasing power dissipation at the quenching stage.

SUMMARY OF THE INVENTION

The object of the present invention is to prevent the aforementioned problems. To achieve this object, the invention provides for an integrated device in an emitter-switching configuration. The device comprises a first bipolar transistor having a base region an emitter region, and a collector region, a second transistor having a charge-collection terminal connected to an emitter terminal of the first transistor, a quenching element having a terminal connected to a base terminal of the first transistor, and wherein the quenching element is formed within the base region or the emitter region of the first transistor.

The integrated device of the present invention is particularly compact and occupies a limited space on the semiconductor chip.

Moreover, the structure is inexpensive, simple and does not require any additional elements for polarizing the region in which the quenching element is formed.

Finally, the device according to the present invention has a low resistance in series with the quenching element so that power dissipation at the quenching stage is reduced.

BRIEF DESCRIPTION OF THE DRAWINGS

Further characteristics and advantages of the integrated device according to the present invention will become clear from the following description of a preferred embodiment thereof, given by way of non-limiting example with reference to the appended drawings, in which.

DETAILED DESCRIPTION OF A PREFERRED EMBODIMENT OF THE INVENTION

Figure 2A:
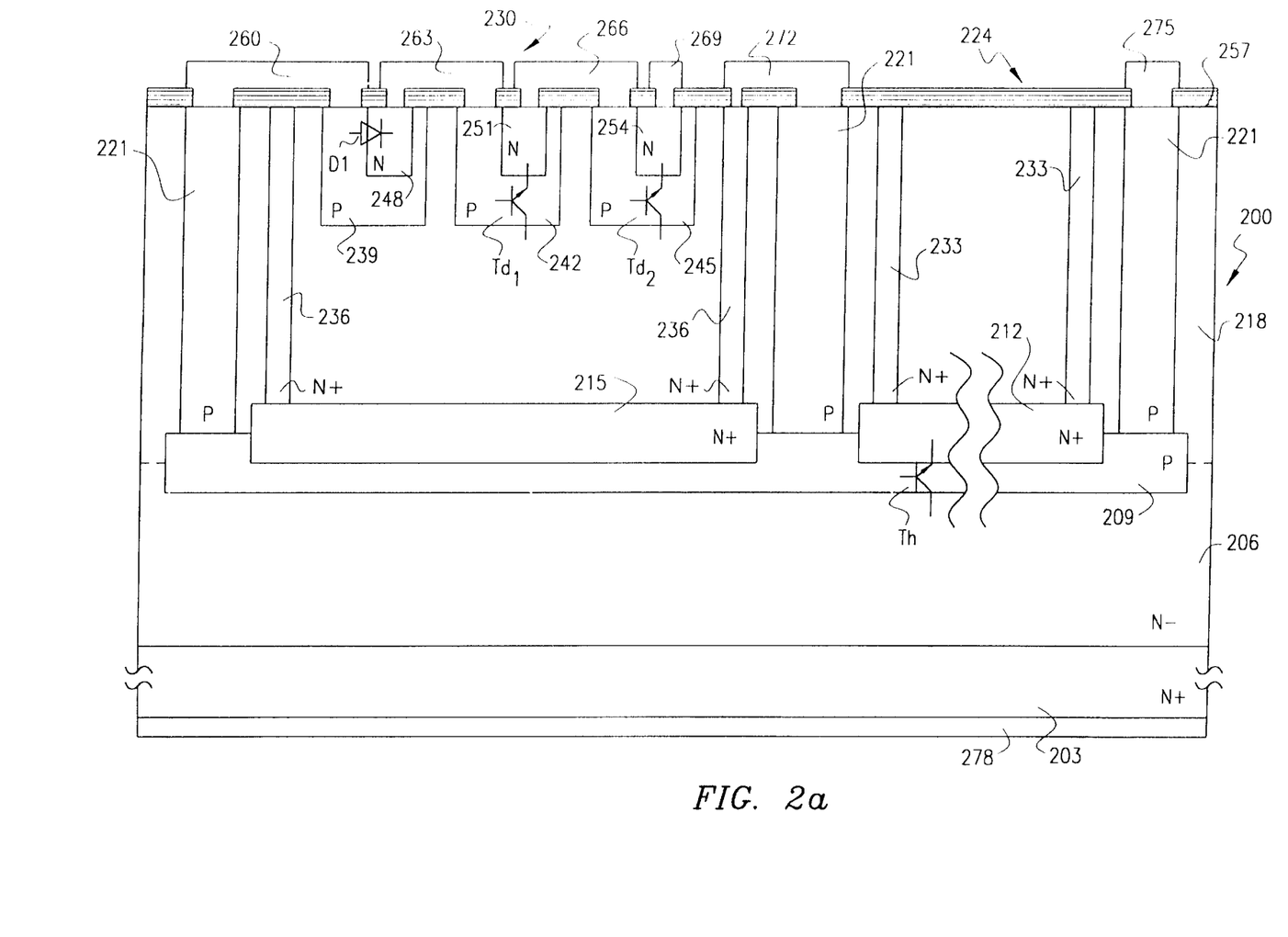
FIGS. 2a–2c, 3a–3c and 4a–4b are schematic views showing various embodiments of the present invention in section, with the respective equivalent circuits.
Figure 2B:
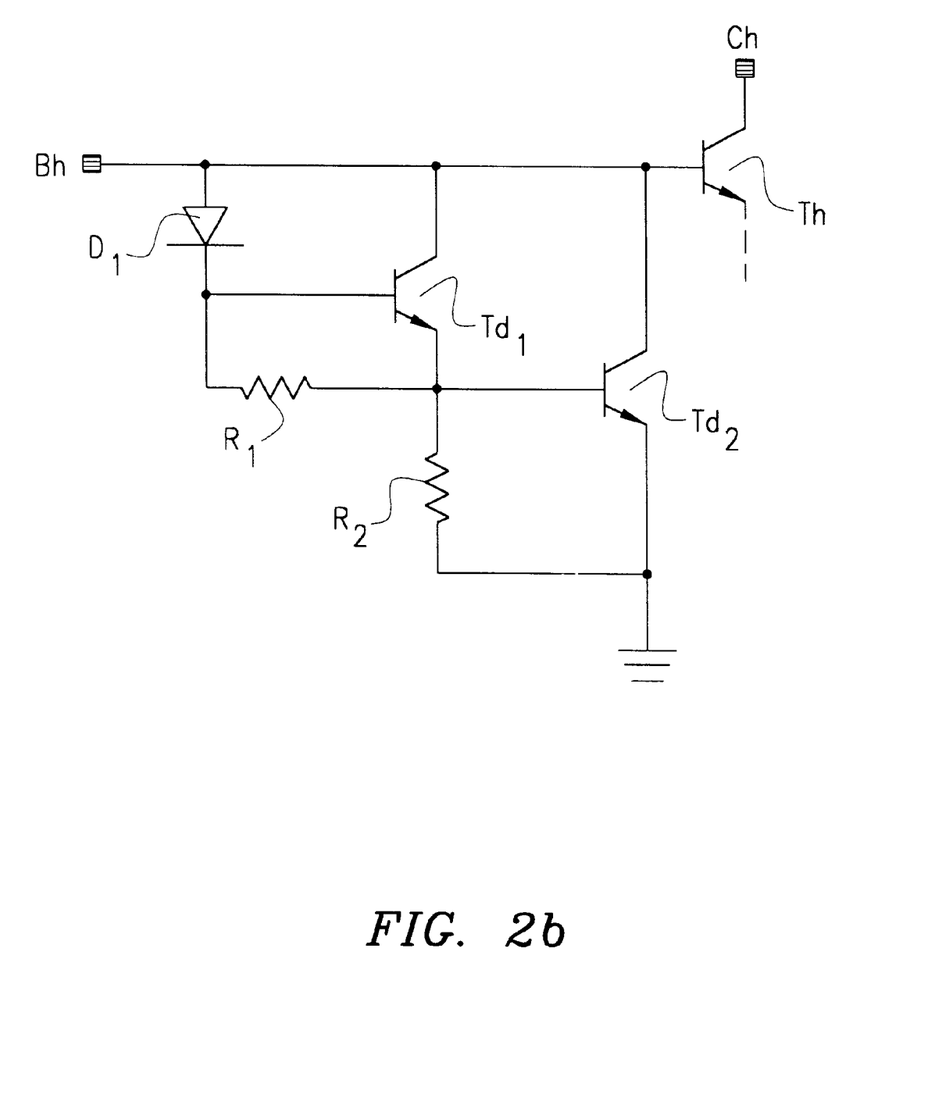

With reference now to the drawings and, in particular, with reference to FIGS. 2a and 2b (FIG. 1 has been described above), an integrated device 200 in an emitter-switching configuration according to the present invention is formed in a chip of semiconductor material doped with n-type impurities. Dual considerations are however applicable if the n-type regions are replaced by corresponding p-type regions and vice versa. As usual, the concentrations of the n- and p-type impurities are indicated by the addition of the "+" sign or the "−" sign to the letters n and p to indicate a high or low concentration of impurities, respectively; the letters n and p without the addition of "+" or "−" signs denote intermediate concentrations. The device 200 is formed, by way of example, with the use of the VIPower process (VIPower is a trade mark of SGS-THOMSON MICROELECTRONICS S.r.l.), described in European patent application EP 322040 in the name of SGS-THOMSON MICROELECTRONICS S.r.l., in which the high-voltage transistors have a structure with entirely vertical conduction, with the various p-n junctions buried, and with the collector electrode formed on the lower surface of the chip. The present invention may, however, also be implemented by different methods in which, for example, the collector electrode of the high-voltage transistors is provided on the upper surface of the chip.

The semiconductor chip comprises a substrate 203, typically of monocrystalline silicon strongly doped with n-type impurities (n+); a first epitaxial layer 206 with the same type of conductivity but with a low concentration of impurities (n−) is formed on the substrate 203 by epitaxial growth. A p-type region 209 having an intermediate impurities value (p) is formed on the upper surface of the epitaxial layer 206 by ionic implantation and subsequent diffusion; two regions 212 and 215 with n+ doping are then formed on the p-type region 209 by a subsequent implantation and diffusion step. A second n-type epitaxial layer 218 having a concentration of impurities greater than or equal to that of the first layer 206 is formed thereon by epitaxial growth. In this step, which takes place at high temperature, the previously-implanted p-type and n-type impurities diffuse further in the two epitaxial layers 206 and 218 giving rise to buried regions which define buried p-n junctions.

A p-type contact region 221 extending through the whole of the second epitaxial layer 218 and connected to the buried region 209, is then formed in the second epitaxial layer 218 by known masking, implantation and diffusion techniques so as to define two portions 224 and 230 of the epitaxial layer 218. An enrichment region 233 and an n+ contact region 236 connected to the buried regions 212 and 215, respectively, are then formed by similar techniques. At least one p-type region is formed by similar implantation and diffusion techniques (or alternatively by a deposition process) within a portion of epitaxial layer delimited by the contact region 236; in the embodiment shown in the drawing in particular, three regions 239, 242 and 245 are shown. A respective n-type region 248, 251 or 254 is then implanted and diffused within each of the regions 239, 242 and 245.

Conductive tracks, for example, made of metal or polycrystalline silicon in contact with surface regions of the semiconductor chip are then formed on the upper surface of the chip which is covered with an insulating layer 257 (typically silicon dioxide) by known deposition, masking and etching techniques. In particular, a track 260 connects the region 221 to the region 239, a track 263 connects the region 248 to the region 242, a track 266 connects the region 251 to the region 245, a track 269 is in contact with the region 254, a track 272 connects the region 236 to the region 221, and a track 275 is in contact with the region 221. A conductive layer 278 is formed on the base of the chip, that is, on the free surface of the substrate 203.

The circuit equivalent to the integrated structure 200 (the elements already shown in FIG. 1 are identified by the same reference numerals or symbols) comprises a high-voltage npn bipolar transistor Th constituted by a portion of n semiconductor material (the substrate 203 and the epitaxial layer 206) disposed between the buried region 209 and the lower surface of the chip (collector), by the p-type region 209, 221 (base) and by the n-type region 224 comprising the buried region 212 and the enrichment region 233 (emitter); the track 275 and the layer 278 constitute the base terminal Bh and the collector terminal Ch of the transistor, respectively. In plan, the transistor Th typically has a so-called interdigitated geometrical shape in which the emitter region extends like a comb with elongate portions (fingers) within the base region. A low-voltage bipolar or field-effect transistor (not shown in the drawing) is formed within the emitter region 224 of the transistor Th and has its collector or drain region in common with the emitter region 224 of the transistor Th. The enrichment region 233 is advantageously used to increase the doping of a base region and hence to reduce the gain of a lateral parasitic pnp transistor formed by a p region of the low-voltage transistor, by the n region 224, and by the p region 221.

The device comprises a quenching element formed within the base region of the transistor Th and, in particular, within an extension thereof shown in the left-hand portion of FIG. 2a. The quenching element includes a vertical npn bipolar transistor Td1 formed by the n region 230 comprising the buried region 215 and the contact region 236 (the collector when the transistor Th is conducting), by the p region 242 (base) and by the n region 251 (emitter), and a further vertical npn bipolar transistor Td2 formed similarly by the n region 230 (collector), by the p region 245 (base) and by the n region 254 (emitter). The emitter terminal of the transistor Td1 is connected to the base terminal of the transistor Td2 by means of the track 266 and the collector terminals of the transistors Td1 and Td2 are connected to the base terminal of the transistor Th by means of the track 272; the track 269 constitutes the emitter terminal of the transistor Td2 and typically is connected to the earth terminal. Advantageously, anti-leakage resistors R1 and R2 (not shown in FIG. 2a) are formed within the region 230 and are connected by suitable conductive tracks between the base and emitter terminals of the transistors Td1 and Td2, respectively. These resistors R1, R2 enable currents caused by structural leakages of the integrated circuit and injected into the base terminals of the transistors Td1, Td2 to be "shunted." The resistors R1, R2 have a resistance (for example, from a few hundred $\Omega$ to a few tens of k$\Omega$) such that the voltage drop therein is always below the threshold voltage Vbe of the transistors Td1, Td2 so as to avoid switching them on undesirably. The quenching element also comprises a diode D1 formed by the p-type region 239 (anode) and by the n-type region 248 (cathode). The anode terminal of the diode D1 is connected to the base terminal of the transistor Th by means of the track 260 and the cathode terminal is connected to the base terminal of the transistor Td1 by means of the track 263. In practice, the diode D1 is constituted by an npn transistor similar to those described above having a base region 239 and a collector region 230 which are short-circuited by the track 260, the region 221, 209 and the track 272.

Figure 2C:
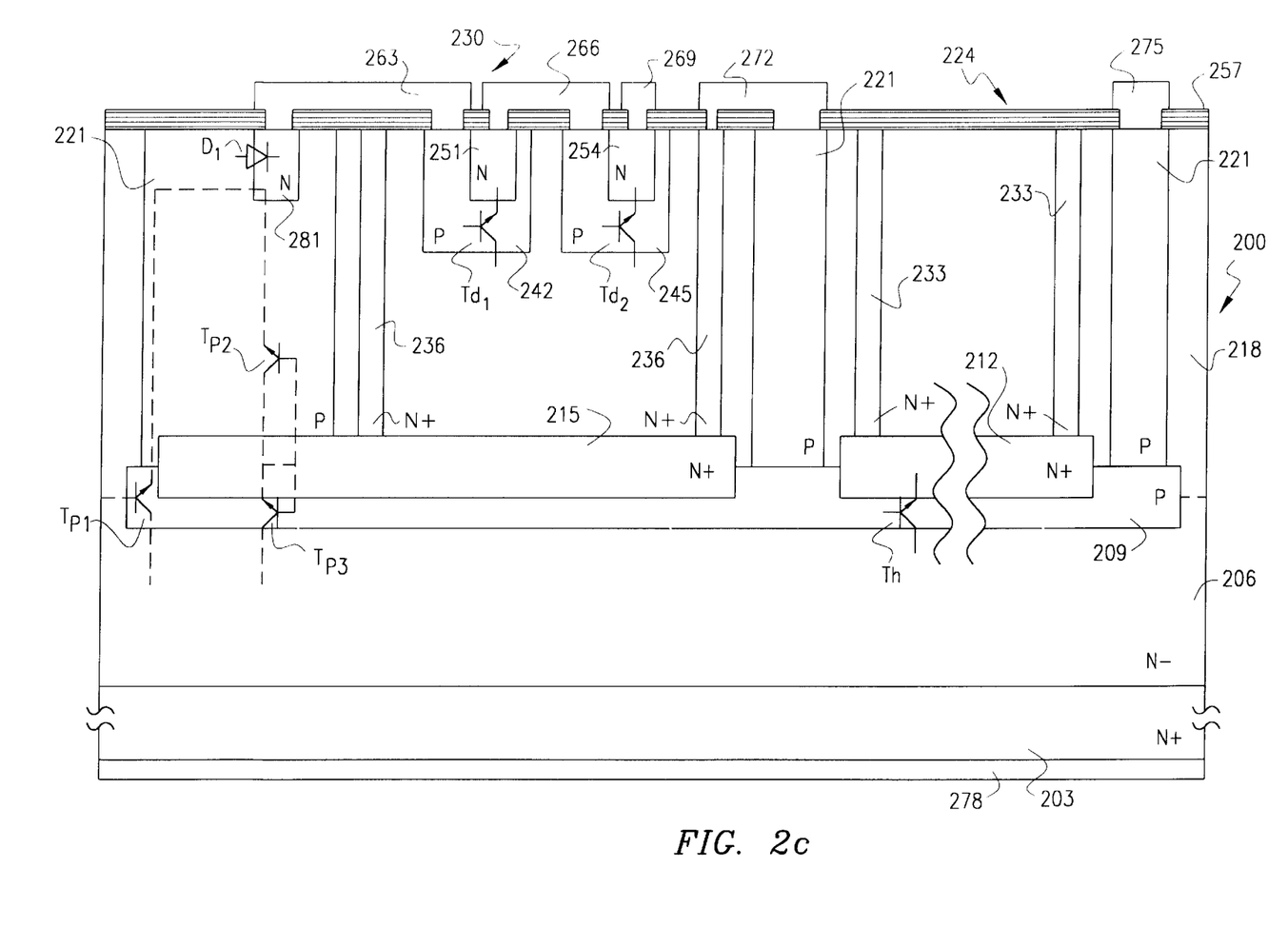

Alternatively, as shown in FIG. 2c, (the elements already shown in FIG. 2a are identified by the same reference numerals or symbols), the diode D1 is formed by the diffusion of an n-type region 281 (cathode) within the contact region 221 (anode). The cathode terminal of the diode D1 is connected to the base terminal of the transistor Td1 by means of the track 263, whereas the anode terminal in this case is connected directly to the base terminal of the transistor Th (common region 221). This embodiment is simpler and more compact and therefore takes up less space on the semiconductor chip.

The region 281 is preferably disposed over a portion of the buried region 215 in plan so as to reduce the effects of a vertical npn parasitic bipolar transistor Tp1 formed by the n region 281 (the emitter when the transistor Th is conducting), by the p region 221, 209 (base), and by the n region 206, 203 (collector). The parasitic transistor Tp1 thus has an extremely wide base so that its gain can be considered negligible. It will be noted that, in the structure shown in the drawing, a vertical parasitic npn bipolar transistor Tp2 formed by the n region 281 (emitter), by the p region 221 (base), and by the buried n+ region 215 (collector) and a further vertical npn parasitic bipolar transistor Tp3 formed by the buried n+ region 215 (emitter), by the buried p region 209 (base) and by the n region 206, 203 (collector) are created. The base terminal and the collector terminal of the transistor Tp2 and the base terminal and the emitter terminal of the transistor Tp3, however, are connected by means of the contact region 236, the track 272, and the contact region 221, so that the transistor Tp3 is always cut off.

Figure 3A:
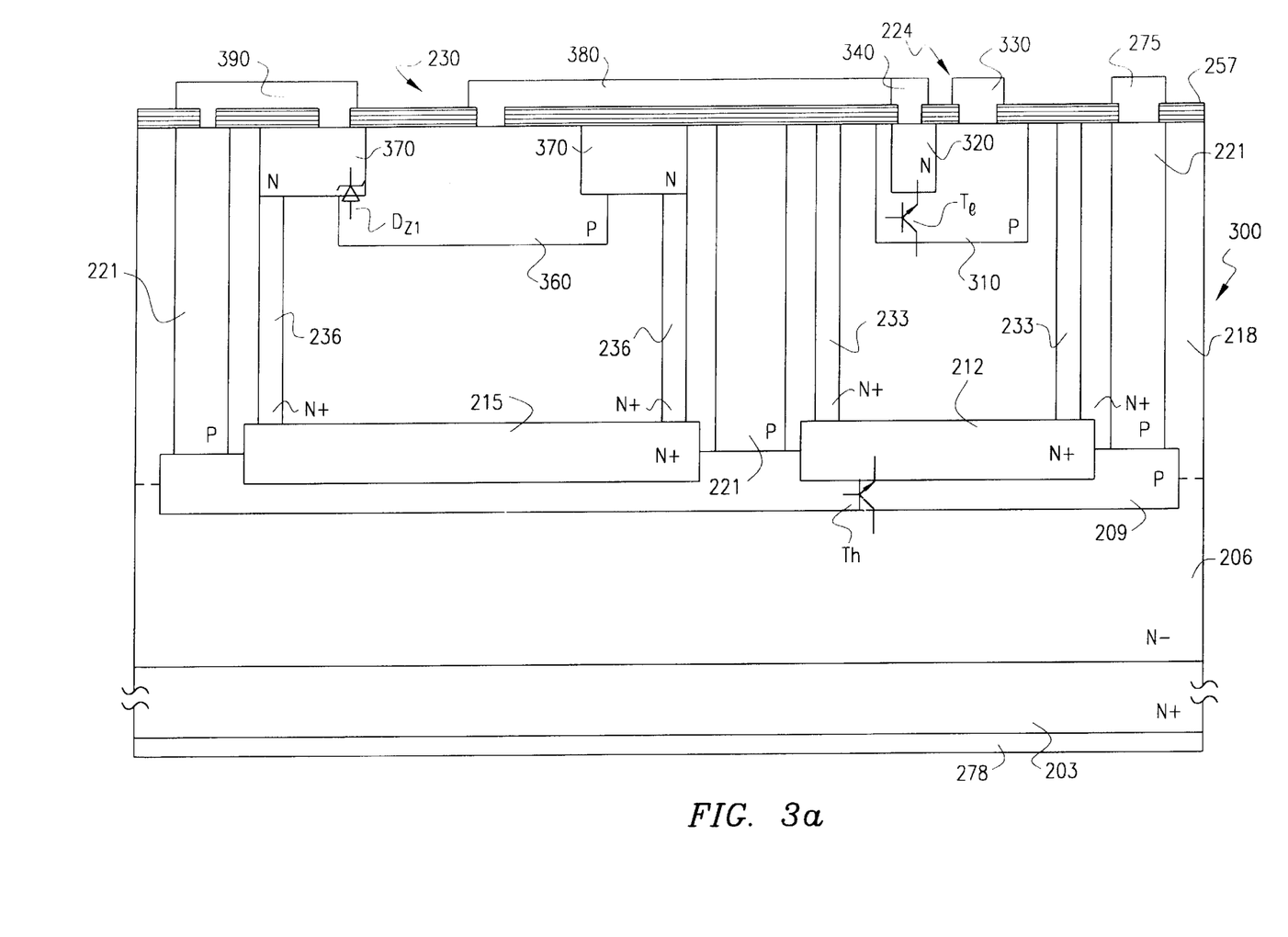
Figure 3B:
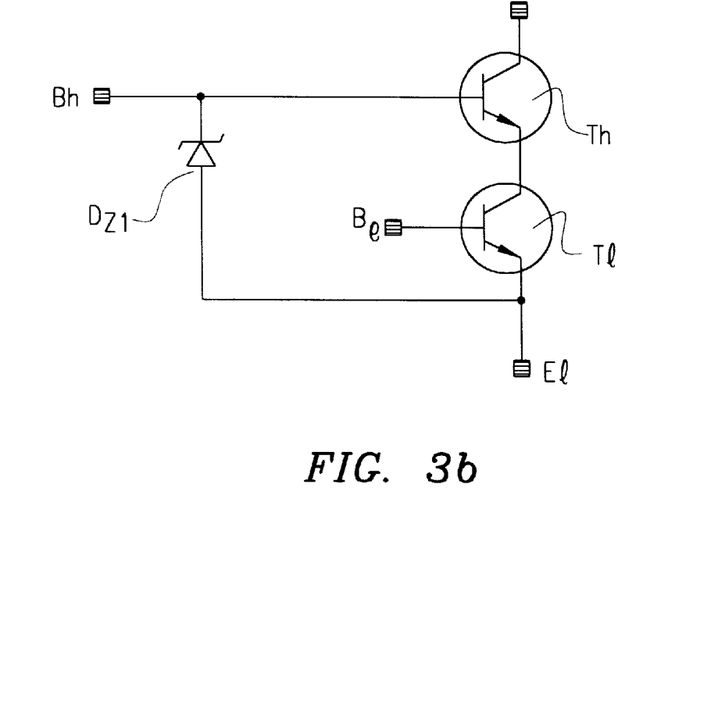

The alternative embodiment shown in FIGS. 3a and 3b (the elements already shown in FIG. 2a are identified by the same reference numerals or symbols) is an integrated device 300 in an emitter-switching configuration in which the low-voltage transistor is constituted by a bipolar transistor T1 and in which the quenching element is constituted by a Zener diode Dz1. In particular, a p-type region 310 is formed within a portion of epitaxial layer delimited by the enrichment region 233 and an n-type region 320 is formed within the p-type region 310, these regions constituting the base region and the emitter region of the transistor T1, respectively. The collector region of the transistor T1 is constituted by the n region 224 comprising the buried region 212 and the enrichment region 233. On the front surface of the chip there are metal tracks 330 and 340 in contact with the regions 310 and 320, respectively, and constituting the base electrode B1 and the emitter electrode E1 of the transistor T1, respectively.

The quenching element is produced by the formation of a p-type region 360 (which constitutes the anode region of the Zener diode Dz1) within the portion of epitaxial layer delimited by the contact region 236. An n-type region 370 (which constitutes the cathode region of the Zener diode Dz1) extends from the upper surface of the chip and contacts the connection region 236 and the region 360 to form a p-n junction with the latter. The anode terminal of the Zener diode Dz1 is connected to the terminal E1 by means of a metal track 380 in surface contact with the region 360 and the cathode terminal is connected to the terminal Bh by means of a further metal track 390 in surface contact with the regions 370 and 221.

Figure 3C:
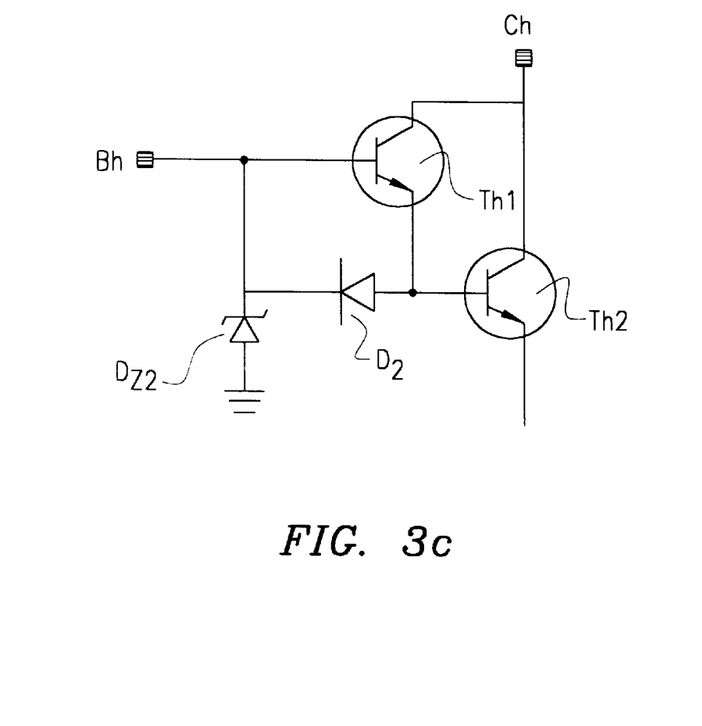

In a different embodiment, as shown in the equivalent circuit of FIG. 3c, the power transistor is constituted by two high-voltage transistors Th1 and Th2 connected in a Darlington configuration, that is, with a common collector terminal and with the emitter terminal of the transistor Th1 connected directly to the base terminal of the transistor Th2. The two transistors Th1 and Th2 are formed in a manner similar to that described above in the same semiconductor chip, so as to have a common collector region (substrate and epitaxial layer). The emitter region of the transistor Th1 is connected to the base region of the transistor Th2 by means of a suitable conductive track.

The quenching element is constituted by a diode D2, the anode and cathode terminals of which are connected to the base terminals of the transistor Th2 and of the transistor Th1, respectively, and by a Zener diode Dz2 having its cathode terminal connected to the base terminal Bh of the transistor Th1 (and its anode terminal typically connected to the earth terminal). The Zener diode Dz2 and the diode D2 are formed in a manner similar to that described above. In particular, the Zener diode Dz2 is formed within the base region of the transistor Th1 (see FIG. 3a) and the diode D2 is formed within the base region of the transistor Th2 (see FIG. 2c). The cathode region of the diode D2 is therefore connected to the base region of the transistor Th1 by means of a suitable conductive track.

Figure 4A:
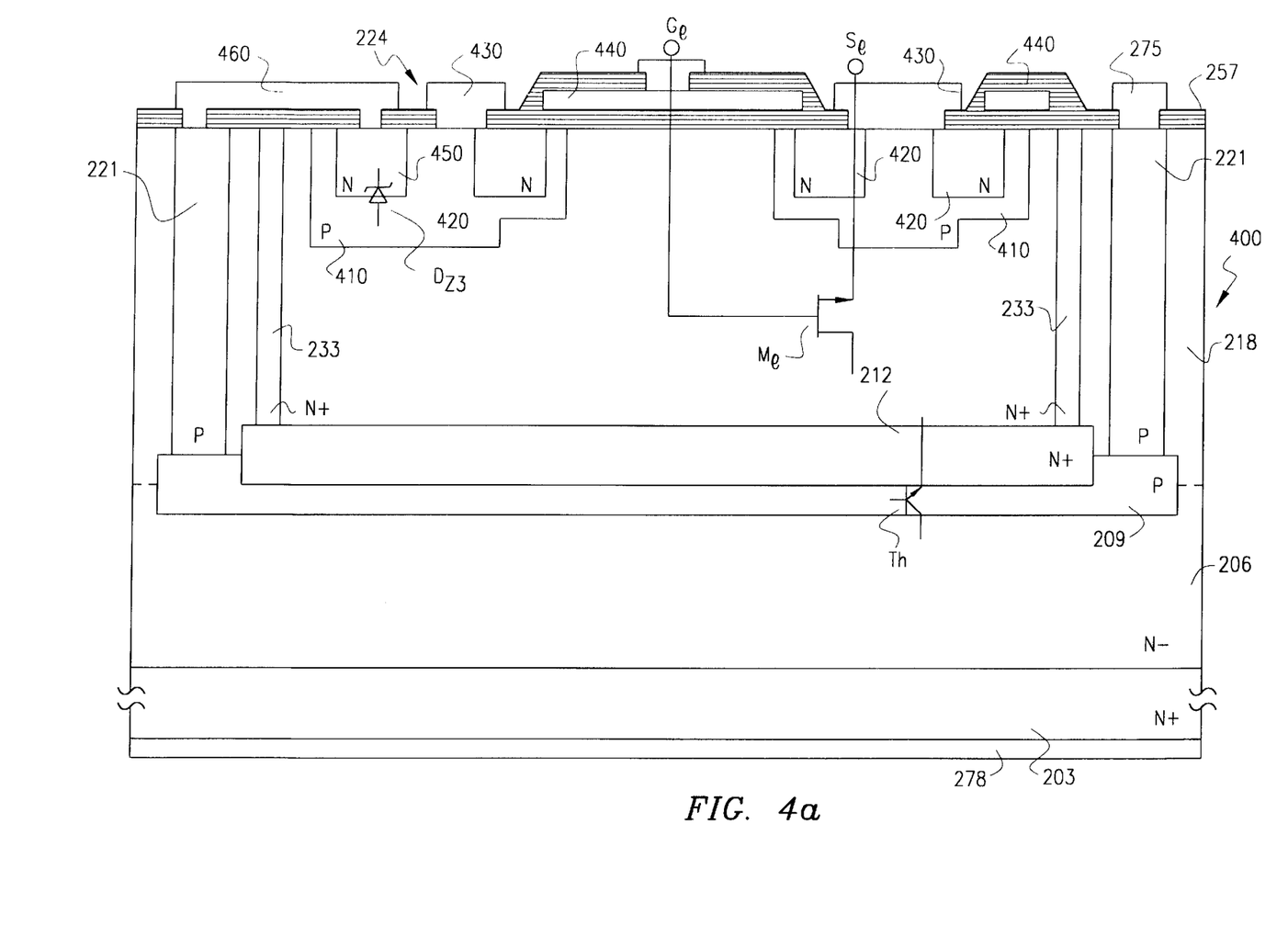
Figure 4B:
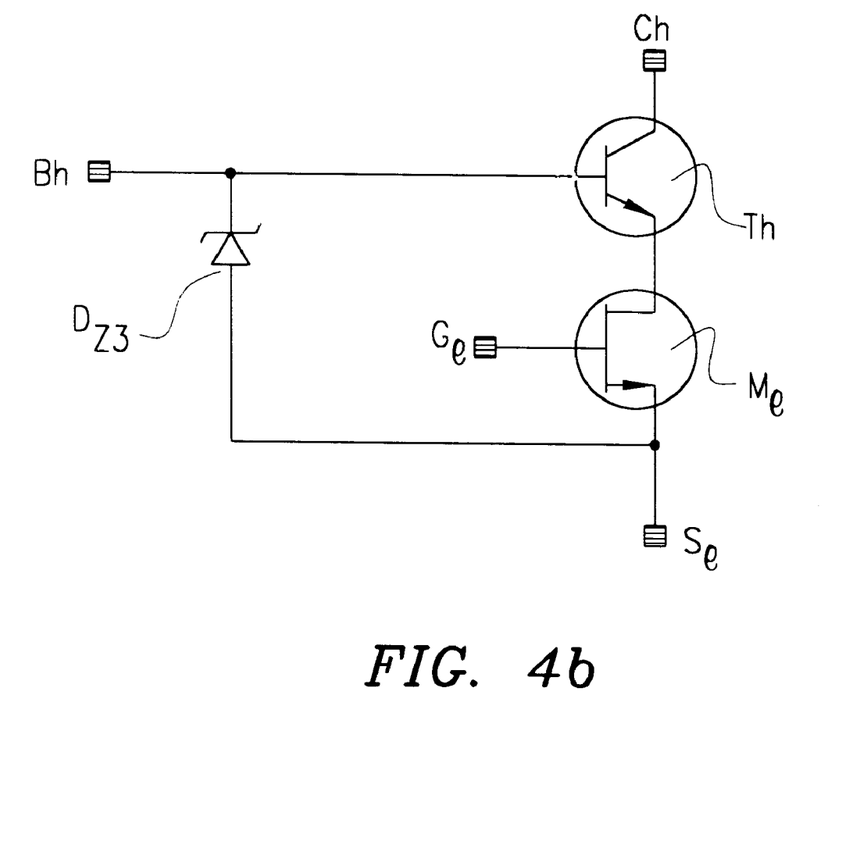

With reference now to FIGS. 4a–4b (the elements already shown in FIG. 2a are identified by the same reference numerals or symbols), these show an integrated device 400 in an emitter-switching configuration in which the low-voltage transistor is constituted by a field-effect (MOS) transistor M1 and in which the quenching element is formed within the emitter region 224 of the transistor Th. It will be noted that, in this embodiment, it is not necessary to form an extension of the base region of the transistor Th so that this structure is particularly simple and compact. In particular, a p-type region 410 is formed within the portion of epitaxial layer delimited by the enrichment region 233 and an n+ region 420 is formed within the p-type region 410, these regions constituting the "body" region and the source region of the transistor M1, respectively. The drain region of the transistor M1 is constituted by the n region 224. On the front surface of the chip there is a metal track 430 which puts the source region 420 into contact with the body region 410 and which forms the source electrode (S1) of the transistor M1. A polycrystalline silicon layer 440 which constitutes the gate electrode (G1) of the transistor M1 is formed on the same front surface in the vicinity of the body region 410 in which the channel of the transistor M1 is formed and is insulated from the surface of the chip by a thin layer of dielectric material.

The quenching element is formed by the insulation of a portion 450 of the n region 420 used to form the source region of the transistor M1 and is constituted by a Zener diode Dz3 formed by the p-type body region 410 (anode) and by the n-type region 450 (cathode). The anode terminal of the Zener diode Dz3 is automatically connected to the source terminal S1 of the transistor M1 (common region 410) without requiring any additional external connection. The cathode terminal is connected to the base terminal Bh of the transistor Th by means of a metal track 460 which connects the region 450 to the contact region 221. Advantageously, several regions 450 are used in similar manner, distributed along the fingers of the transistor Th. The Zener diodes thus produced are connected in parallel between the terminal Bh and the terminal S1 so as to reduce the intrinsic resistance of the base of the transistor Th and hence the additional voltage drop which occurs during the quenching thereof, but without significantly affecting the current flow therein.

Naturally, in order to satisfy contingent and specific requirements, an expert in the art will be able to apply to the above-described integrated device many modifications and variations all of which, however, are included in the scope of protection of the invention as defined by the following claims.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. An integrated device in an emitter-switching configuration, comprising:

a first transistor having a base region, an emitter region, and a collector region;

a second transistor having a charge-collection terminal connected to an emitter terminal of the first transistor; and a quenching element comprising at least one electrical component having a first terminal and a second terminal coupled to the base region of the first transistor for discharging current therefrom when the second transistor is in a cutoff state;

the first transistor, second transistor and quenching element form an integrated device, the quenching element is formed within one of the base region and the emitter region of the first transistor.

2. The device according to claim 1, wherein:

the device is integrated in a chip of semiconductor material with a first type of conductivity having first and second opposed surfaces;

the chip comprises a first region with a second type of conductivity extending from the second surface into the chip and a second region with the first type of conductivity extending from the second surface into the first region; and the first region, the second region and a portion of the chip disposed between the first region and the first surface contain the base, emitter and collector regions of the first transistor, respectively.

3. The device according to claim 2, wherein the second transistor is formed within the second region.

4. The device according to claim 2, wherein the at least one electrical device of the quenching element includes a third region with the first type of conductivity extending from the second surface into the first region, a first conductive track disposed on the second surface in contact with the third region and with the first region, at least one fourth region with the second type of conductivity extending from the second surface into the third region, a fifth region with the first type of conductivity extending from the second surface into the fourth region, a second conductive track disposed on the second surface in contact with the fourth region and with the first region, and at least one third conductive track disposed on the second surface in contact with the fifth region.

5. The device according to claim 2, wherein:

the first and second transistors are bipolar transistors;

the chip includes a third region with the second type of conductivity extending from the second surface into the second region and a fourth region with the first type of conductivity extending from the second surface into the third region;

the second, third and fourth regions containing, respectively, a collector region, a base region and an emitter region of the second transistor; and the at least one electrical device of the quenching element includes a fifth region with the first type of conductivity extending from the second surface into the first region and a sixth region with the second type of conductivity extending from the second surface into the fifth region, a first conductive track disposed on the second surface in contact with the fifth region and with the first region, and a second conductive track disposed on the second surface in contact with the fourth region and with the sixth region.

6. A device according to claim 1, wherein the first type of conductivity of the semiconductor material is n-type and the second type of conductivity thereof is p-type.

7. The device according to claim 2, further comprising:

a third transistor forming a bipolar transistor connected to the first transistor in a Darlington configuration in which an emitter terminal of the third transistor is connected to the base terminal of the first transistor; and wherein the at least one electrical component of the quenching element includes a diode formed within the base region of the first transistor and having an anode terminal and a cathode terminal which are connected to the base terminal of the first transistor and to a base terminal of the third transistor, respectively, and a Zener diode formed within a base region of the third transistor and having a cathode terminal connected to the base terminal of the third transistor.

8. The device according to claim 2, wherein:

the second transistor is a field-effect transistor;

the chip includes a third region with the second type of conductivity extending from the second surface into the second region and a fourth region with the first type of conductivity extending from the second surface into the third region;

the second, third and fourth regions containing a drain region, a body region and a source region of the second transistor, respectively; and the at least one electrical component of the quenching element includes at least one fifth region with the first type of conductivity extending from the second surface into the third region and at least one conductive track disposed on the second surface in contact with the fifth region and with the first region.

9. The device according to claim 2, wherein the first type of conductivity is n and the second type of conductivity is p.

10. The device according to claim 2, wherein:

the first region includes a first buried region and a third region extending from the second surface as far as the first buried region; and the second region includes a portion of the chip delimited by the first region and the second surface and further includes a second buried region forming a buried junction with the first buried region.

11. The device according to claim 10, wherein the second transistor is formed within the second region.

12. The device according to claim 4, further comprising a sixth region with the first type of conductivity extending from the second surface into the first region and in contact with the second conductive track on the second surface.

13. The device according to claim 1, wherein:

the electrical component of the quenching element comprises a zenor diode having a cathode terminal connected to the base region of the first transistor.

14. The device according to claim 13, wherein:

the second transistor comprises a bipolar transistor; and the zenor diode includes an anode terminal connected to the emitter terminal of the second transistor.

15. The device according to claim 13, wherein:

the second transistor comprises a field effect transistor; and the zenor diode includes an anode terminal connected to the source terminal of the second transistor.

16. The device according to claim 4, wherein the at least one electrical component of the quenching element comprises:

a plurality of fourth regions, each fourth region having the second type of conductivity and extending from the second surface into the third region at a distance from other fourth regions;

a plurality of fifth regions, each fifth region having the first type of conductivity and extending from the second surface into a distinct fourth region, the second conductive track connecting the first region to a single fourth region, each fourth region and corresponding fifth region forming a distinct electrical component; and a plurality of third conductive tracks, each conductive track being disposed on the second surface and connecting one fourth region to one fifth region disposed within a different fourth region, the fourth and fifth regions and the third conductive tracks forming a chain of series-connected electrical components through which current from the base terminal of the first transistor flows.

17. The device according to claim 16, wherein:

each electrical component in the chain of series-connected electrical components comprises a vertical transistor.

18. The device according to claim 4, wherein the electrical component comprises a vertical transistor having a collector region, base region and emitter region respectively formed by the third region, the fourth region and the fifth region.

19. The device according to claim 1, wherein both the quenching element and the second transistor are formed within the emitter region of the first transistor.

20. A method of fabricating an emitter switching device in a semiconductor substrate having a first type of conductivity, comprising the steps of:

forming a first region of a second type of conductivity into the semiconductor substrate, the first region comprising the base region of a first transistor and a region between the first region and a first surface of the substrate forming the collector region of the first transistor;

forming a second region of the first conductivity type extending into the first region, the second region comprising the emitter region of the first transistor;

forming a second transistor within the second region, the second transistor having a charge-collection terminal formed from the second region;

forming a third region of the first conductivity type in the first region;

forming a fourth region of the second conductivity type in the third region;

forming a fifth region of the first conductivity type in the fourth region, the fourth and fifth region forming a diode junction; and forming conductive material on a second surface of the semiconductor substrate which couples one of the fourth region and fifth region to the first region so that current can flow from the base region of the first transistor through the diode junction.

21. The method of claim 20, wherein:

the step of forming a fourth region comprises forming a plurality of fourth regions in the third region, each fourth region having the second type of conductivity and extending from the second surface into the third region at a distance from other fourth regions;

the step of forming a fifth region comprises forming a plurality of fifth regions, each fifth region having the first type of conductivity and extending from the second surface into a distinct fourth region, each fourth region and corresponding fifth region forming a third transistor with the third region; and the step of forming conductive material connects the third transistors into a chain of series connected third transistors, with a third transistor at one end of the chain being coupled to the first region and a third transistor at the other end of the chain being connected to a voltage reference.

22. The method of claim 20, further comprising the step of:

forming a sixth region of the first conductivity type in the first region adjacent the third region, the sixth region and at least a portion of the first region forming a diode;

wherein the step of forming conductive material electrically connects the sixth region to the fourth region.

23. The method of claim 20, wherein:

the diode junction comprises a zenor diode junction.

24. The method of claim 20, wherein:

the step of forming a conductive material connects one of the fourth region and the fifth region to a terminal of the second transistor.

25. An emitter switching device, comprising:

a first transistor formed in a semiconductor substrate having an emitter region, a base region and a collector region;

a second transistor having a charge-collecting region that is shared with the emitter region of the first transistor; and at least one electrical component formed within the area bounded by the base region of the first transistor, the electrical component being coupled to the base region of the first transistor for sinking current therefrom.

26. The emitter switching device of claim 25, wherein:

the electrical component comprises a diode junction having a first diode region defined in the base region of the first transistor and a second diode region defined in the first diode region, the second diode region having a conductivity type that is opposite the conductivity type of the first diode region; and the base region of the first transistor is coupled to one of the first diode region and the second diode region by a track of conductive material disposed on the surface of the semiconductor substrate.

27. The emitter switching device of claim 25, wherein:

the electrical component comprises a plurality of diode junctions, at least one diode junction forming part of a transistor, each diode junction having a first diode region defined in the base region of the first transistor and a second diode region defined in the first diode region, each second diode region having a conductivity type that is opposite the conductivity type of the corresponding first diode region;

the diode junctions being electrically connected in series with each other by a plurality of first tracks of conductive material disposed on the semiconductor substrate; and the base region of the first transistor is coupled to the first diode region of one of the diode junctions, by a second track of conductive material.

28. The emitter switching device of claim 25, wherein:

the at least one electrical component includes a zenor diode having a cathode terminal connected to the base region of the first transistor.

29. The emitter switching device of claim 25, wherein:

the electrical component comprises a third transistor having a base region defined in the base region of the first transistor, a collector region and an emitter region defined in the base transistor region of the third transistor, the base region of the third transistor having a conductivity type that is opposite the conductivity type of the emitter region of the third transistor; and the base region of the first transistor is coupled to the base region of the third transistor by a first track of conductive material disposed on the semiconductor substrate, and connected to the collector region of the third transistor by a second track of conductive material disposed on the semiconductor substrate.

30. The emitter switching device of claim 25, wherein:

the electrical component comprises a diode defined within the emitter region of the first transistor; and the second transistor is formed within the emitter region of the first transistor.

31. The emitter switching device of claim 25, wherein:

the second transistor comprises a field effect transistor having a drain/source region that is shared with the emitter region of the first transistor.

32. The device according to claim 4, wherein the third region includes a further portion of the chip delimited by the first region and by the second surface and includes a third buried region forming a buried junction with the first buried region and a further contact region extending from the second surface as far as the third buried region.

\* \* \* \* \*